(12) United States Patent
Shimizu et al.

(10) Patent No.: US 6,566,748 B1
(45) Date of Patent: May 20, 2003

(54) FLIP-CHIP SEMICONDUCTOR DEVICE HAVING AN IMPROVED RELIABILITY

(75) Inventors: Nobutaka Shimizu, Kawasaki (JP); Kazuyuki Imamura, Kawasaki (JP); Atsushi Kikuchi, Kawasaki (JP); Masaharu Minamizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/615,728

(22) Filed: Jul. 13, 2000

(51) Int. Cl.[7] .......................... H01L 23/12; H01L 23/10
(52) U.S. Cl. .................. 257/704; 257/706; 257/707; 257/718; 257/675
(58) Field of Search ................ 257/703–707, 257/729, 720, 710–713, 718–722, 675, 778

(56) References Cited

U.S. PATENT DOCUMENTS

| | | | |
|---|---|---|---|
| 5,532,513 A | * | 7/1996 | Smith et al. ............... 257/703 |
| 6,057,402 A | * | 5/2000 | Zhou et al. ................ 525/122 |
| 6,104,093 A | * | 8/2000 | Caletka et al. ............. 257/778 |
| 6,245,442 B1 | * | 6/2001 | Towata et al. ............. 428/614 |
| 6,395,203 B1 | * | 5/2002 | Brun | |

* cited by examiner

*Primary Examiner*—Wael Fahmy
*Assistant Examiner*—DiLinh Nguyen
(74) *Attorney, Agent, or Firm*—Armstrong, Westerman & Hattori, LLP

(57) ABSTRACT

A BGA semiconductor device includes a package substrate carrying thereon a semiconductor chip in a face-down state and a cap member covering the semiconductor chip on the package substrate, wherein the cap member has a optimized Young modulus smaller than about 20 GPa and a thermal conductivity exceeding about 100 W/(m·K).

11 Claims, 9 Drawing Sheets

FLIP-CHIP SEMICONDUCTOR DEVICE HAVING AN IMPROVED RELIABILITY

BACKGROUND OF THE INVENTION

The present invention generally relates to semiconductor devices and more particularly to a flip-chip semiconductor device in which a semiconductor chip is mounted on a substrate in a face-down state.

With increasing degree of device miniaturization in the field of semiconductor technology, there has been a need to provide a sufficient number of contact leads when the semiconductor device is assembled in the form of a semiconductor package.

In view of the foregoing needs, there is a BGA package structure in which a semiconductor chip carrying thereon bump electrodes in correspondence to the electrodes of the chip are mounted on a package substrate in a face-down state. The semiconductor chip thus flip-chip mounted on the package substrate is covered by a cap member, which functions also as a heat sink. The package substrate, on the other hand, carries further bump electrodes on a side thereof opposite to the side on which the semiconductor chip is flip-chip mounted, and the semiconductor device thus formed of the package substrate is mounted on a main substrate, which may be a printed circuit board of an electronic apparatus.

FIG. 1 shows the construction of a BGA semiconductor device 10 according to a related art.

Referring to FIG. 1, the semiconductor device 10 includes a package substrate 11 on which a semiconductor chip 12 is flip-chip mounted, such that bump electrodes 12A typically of a Sn—Ag alloy and formed on the bottom surface of the semiconductor chip 12 make a contact engagement with a corresponding wiring pattern (not shown) provided on a top surface of the package substrate 11. Further, bump electrodes 11A are provided on a bottom surface of the package substrate 11 in electrical connection with the wiring pattern provided on the top surface, wherein the bump electrodes 11A may be formed of a solder bump. The bump electrodes 11A form a ball grid array on the bottom surface of the package substrate 11.

The semiconductor chip 12 thus flip-chip mounted on the package substrate 11 is then covered by a cap member 13, wherein the cap member 13 is thermally connected to the semiconductor chip 12 via a thermally conductive adhesive layer 13A such as a silver paste. The cap member 13 thereby functions as a heat sink. The cap member 13 is also fixed to the top surface of the package substrate 11 mechanically by an adhesive layer 13B such as an epoxy resin. Further, a resin layer 12B, typically of an epoxy resin, fills the space formed between the bottom surface of the semiconductor chip 12 and the top surface of the package substrate 11, in which space the bump electrodes 12A make a contact engagement with the wiring patterns on the package substrate 11. By filling the space with the resin layer 12B, the reliability of electrical contact of the bump electrodes 12A is improved.

It should be noted that the BGA semiconductor device 10 is then mounted on a main substrate 14, which may be a printed circuit board of an electronic apparatus. Typically, the package substrate 11 is formed of a multilayer ceramic substrate or a multilayer resin substrate. On the other hand, the cap member 13 acting as the heat sink is formed of a thermal conducting material such as Cu, Al, Al—SiC or AlN.

In the device 10 of FIG. 1, a typical cap member 13 is formed of an Al—SiC composite having a Young modulus of 110 GPa. In this case, the thermal expansion coefficient of the cap member 13 has a value of $1.2 \times 10^{-5}/°C$. In conformity with the thermal expansion coefficient of the cap member 13, the package substrate 11 may be formed of a glass ceramic having a thermal expansion coefficient of $1.2 \times 10^{-5}/°C$. The glass ceramic substrate 11 typically has a Young modulus of 70–75 GPa. On the other hand, the main substrate 14 is typically formed of a glass-epoxy resin and has a thermal expansion coefficient of $1.6–1.7 \times 10^{-5}/°C$.

In the actual use of the BGA semiconductor device 10 in an electronic apparatus, the semiconductor device 10 is subjected to a thermal cycle process associated with turning-on and turning-off of the electronic apparatus. Thereby, such a temperature cycle induces a thermal stress in the semiconductor device 10 particularly in correspondence to the part where the bump electrodes 11A make an electric contact with corresponding wiring patterns on the main substrate 14, and there is a risk that the contact fails as a result of fatigue.

This problem of fatigue appears conspicuously when the difference in the thermal expansion coefficient between the BGA semiconductor device 10 and the main substrate 14 is large. Further, the problem of foregoing thermal fatigue appears conspicuously when the rigidity is increased for the semiconductor device 10. Further, the problem of foregoing thermal fatigue appears conspicuously when the lateral size of the semiconductor device 10, and hence the distance across the outermost bump electrodes on the package substrate 11 is increased.

In view of the fact that the number of input/output terminals is increasing in the advanced high-performance semiconductor devices of these days, the number of the bump electrodes 11A on the package substrate 11 is now reaching the order of several hundreds to several thousands. Associated with this, the distance across the outermost bump electrodes is also increasing and the reliability of the electrical contact has become a serious problem in these advanced, high-performance semiconductor devices.

FIG. 2 shows another BGA semiconductor device 10A according to a related art, wherein those parts corresponding to the parts described previously are designated by the same reference numerals and the description thereof will be omitted.

Referring to FIG. 2, the BGA semiconductor device 10A has a similar construction as the BGA semiconductor device 10 of FIG. 1, except that the cap member 13 is replaced with a cap member 23 having a reduced thickness. Thereby, the rigidity of the BGA semiconductor device 10A is reduced as compared with the BGA semiconductor device 10 and the problem of the fatigue of the bump electrodes 11A is reduced.

On the other hand, in view of the fact that the thickness of the cap member 23 is reduced, the cap member 23 no longer functions as an effective heat sink and the semiconductor device 10A of FIG. 2 suffers from the problem of abnormal operation and abnormal temperature rise associated with poor cooling. In the case of the device of FIG. 1, the cap member 13 has a thickness of about 2 mm at the top part contacting the semiconductor chip 12, while the cap member 23 in the semiconductor device 10A of FIG. 2 has a thickness of only 0.3 mm.

SUMMARY OF THE INVENTION

Accordingly, it is a general object of the present invention to provide a novel and useful semiconductor device wherein the foregoing problems are eliminated.

Another and more specific object of the present invention is to provide a BGA semiconductor device having a package substrate on which a semiconductor chip is flip-chip mounted, wherein the reliability of contact with an external substrate is improved for the electrode bumps that are provided on the package substrate, while maintaining an excellent heat dissipation performance.

Another object of the present invention is to provide a semiconductor device, comprising:
 a package substrate;
 a semiconductor chip mounted on a top surface of said package substrate in a face-down state;
 a cap member provided on said top surface of said package substrate so as to cover said semiconductor chip, said cap member making a contact with said semiconductor chip and said top surface of said package substrate; and
 electrodes provided on a bottom surface of said package substrate,
 said cap member having a thermal conductivity not smaller than about 100 W/(m·K) and a Young modulus not exceeding about 20 GPa.

According to the present invention, the rigidity of the semiconductor device as a whole is reduced as a result of the use of the cap member having a Young modulus not exceeding about 20 GPa, and the problem of mechanical fatigue caused in the electrodes on the bottom surface of the package substrate due to the difference of thermal expansion coefficient between the semiconductor device and a substrate on which the semiconductor device is mounted is reduced. As the cap member maintains a high thermal conductivity, the decrease of the rigidity of the semiconductor device does not causes the problem of poor thermal dissipation.

Preferably, the cap member has a thermal expansion coefficient equal to or smaller than $3 \times 10^{31}$ $^{5}/^{\circ}$ C. The cap member may be formed of a metal-infiltrated carbon composite material. Further, the cap member may be formed of a directional carbon/metal composite material having a reduced modulus of elasticity in a lateral direction thereof as compared with a thickness direction thereof.

Other objects and further features of the present invention will become apparent from the following detailed description when read in conjunction with the attached drawings.

DETAILED DESCRIPTION OF THE INVENTION

Principle

Figure 1:
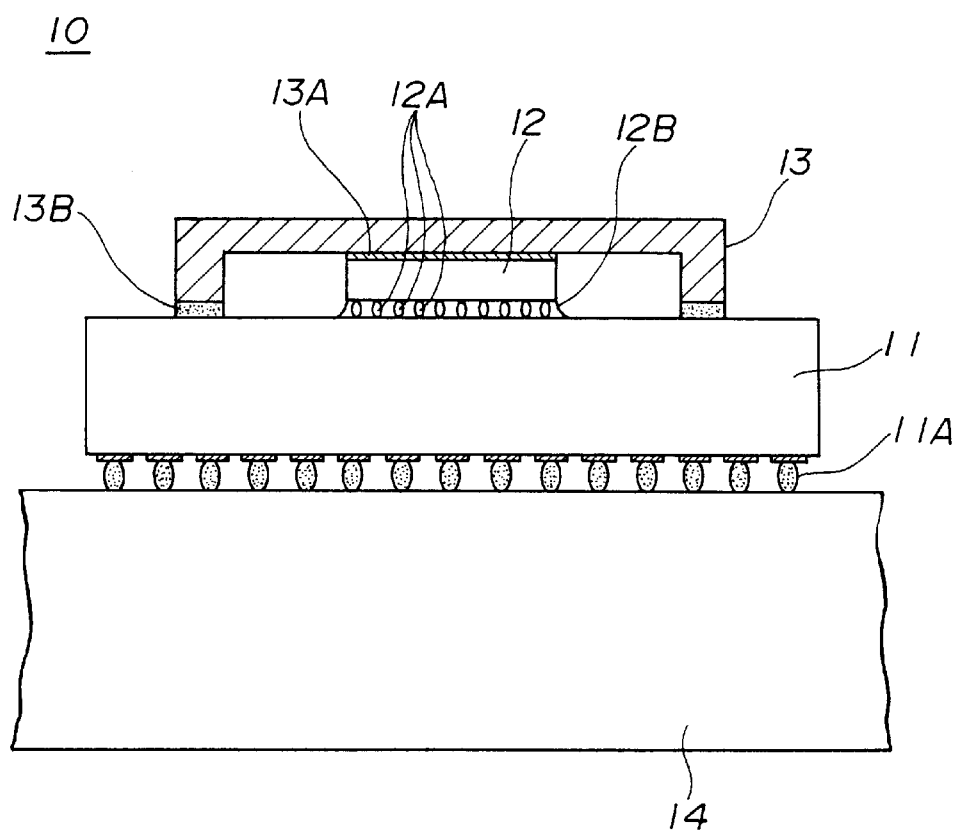
FIG. 1 is a diagram showing the construction of a BGA semiconductor device according to a related art.
Figure 2:
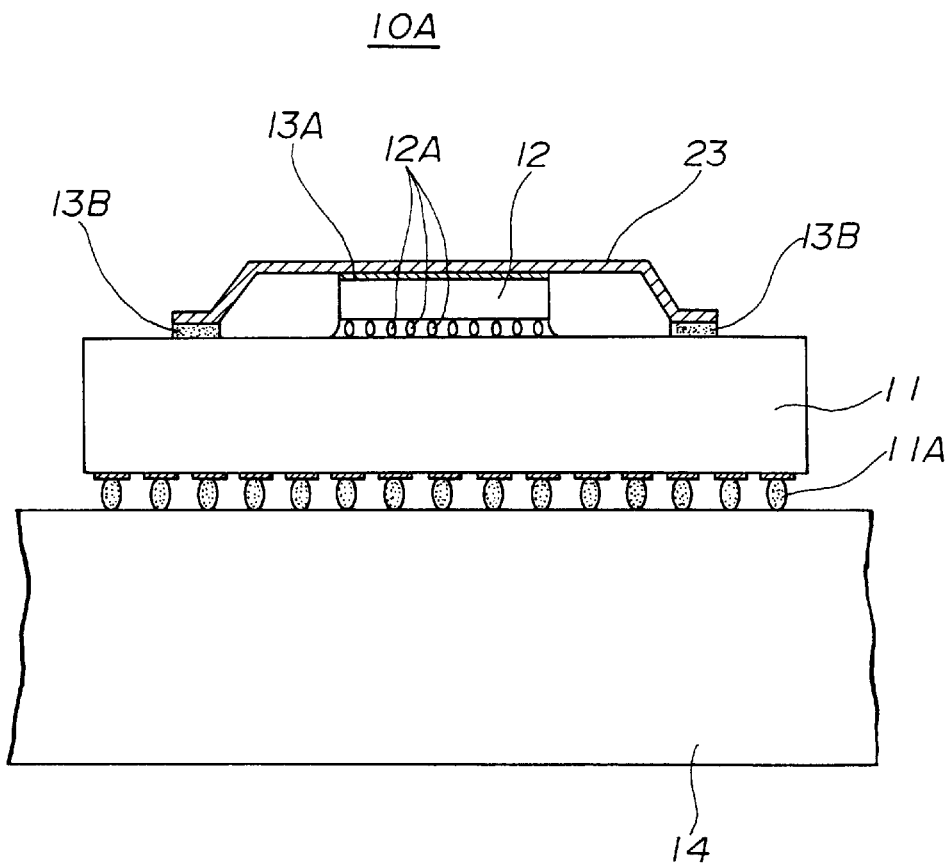
FIG. 2 is a diagram showing the construction of a BGA semiconductor device according to another related art.
Figure 3:
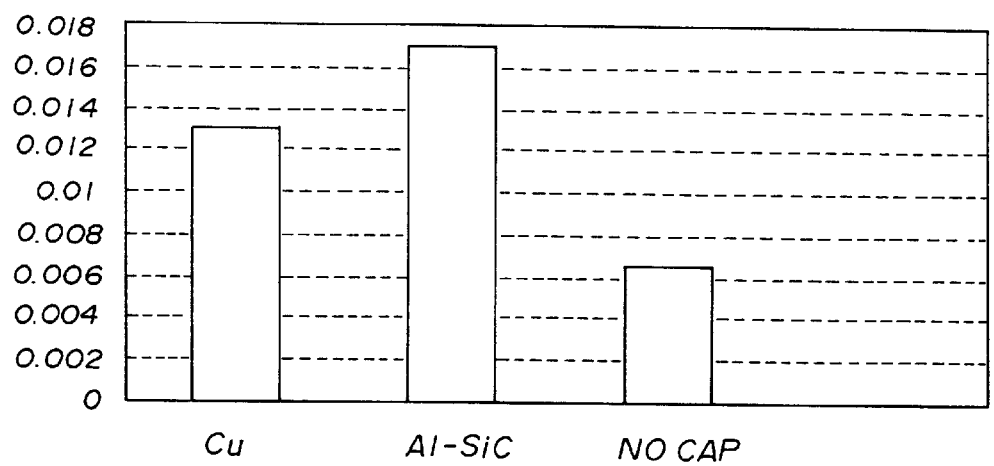
FIG. 3 is a diagram showing the discovery constituting the principle of the present invention.

FIG. 3 shows the result of evaluation of the strain $\Delta\epsilon$ induced at the bump electrode 11A in the structure of FIGS. 1 and 2 when a thermal cycle is applied between $-25°$ C. and $125°$ C. As can be seen in FIG. 3, the evaluation was made for two types of cap members (member 13 of FIG. 1 and member 23 of FIG. 2). The evaluation itself was conducted by a finite-element method for the structures of FIGS. 1 and 2 in which the heights of the cap members 13 and 23 on the package substrate 11 were set to 2.65 mm and 1.425 mm, respectively. The thicknesses of the cap members 13 and 23 contacting the semiconductor chip 12 were set to 2.05 mm and 0.3 mm respectively, and the thickness and the size of the package substrate 11 were set to 1.85 mm and 40 mm respectively for the both package structures. The edge lengths of the cap members 13 and 23 were set to 39 mm and 35 mm, respectively.

Referring to FIG. 3, it can be seen that the strain $\Delta\epsilon$ at the bump electrode 11A becomes maximum and reaches a value of as much as 0.017 when the Al—SiC composite is used for the cap member 13. When Cu is used for the cap member 23, it was discovered that the strain $\Delta\epsilon$ is reduced to about 0.013. When no cap member 13 is provided on the package substrate 11, on the other hand, the strain $\Delta\epsilon$ is reduced to less than 0.007.

The result of FIG. 3 indicates that the material, particularly the rigidity of the cap member 13 influences the strain $\Delta\epsilon$ substantially and that the value of the strain $\Delta\epsilon$ can be optimized to be about 0.01 or less when the Young modulus of the cap member 13 is reduced to about 20 GPa or less. It should be noted that the cap member 13 cannot be eliminated in the structure of FIG. 1, as the cap member 13 has a function of heat sink removing heat from the flip-chip mounted semiconductor chip 12.

While there are various materials having a Young modulus of 20 GPa or less, the material for the cap member 13 of the BGA semiconductor device 10 is also required to have a large thermal conductivity of 100 W/(mK) or more. Further, the cap member 13 should have a small thermal expansion coefficient comparable with the thermal expansion coefficient of the semiconductor chip 12.

Thus, the present invention uses a material satisfying the foregoing criteria for the cap member 13 of the BGA semiconductor device structure of FIG. 1.

First Embodiment

Figure 4:
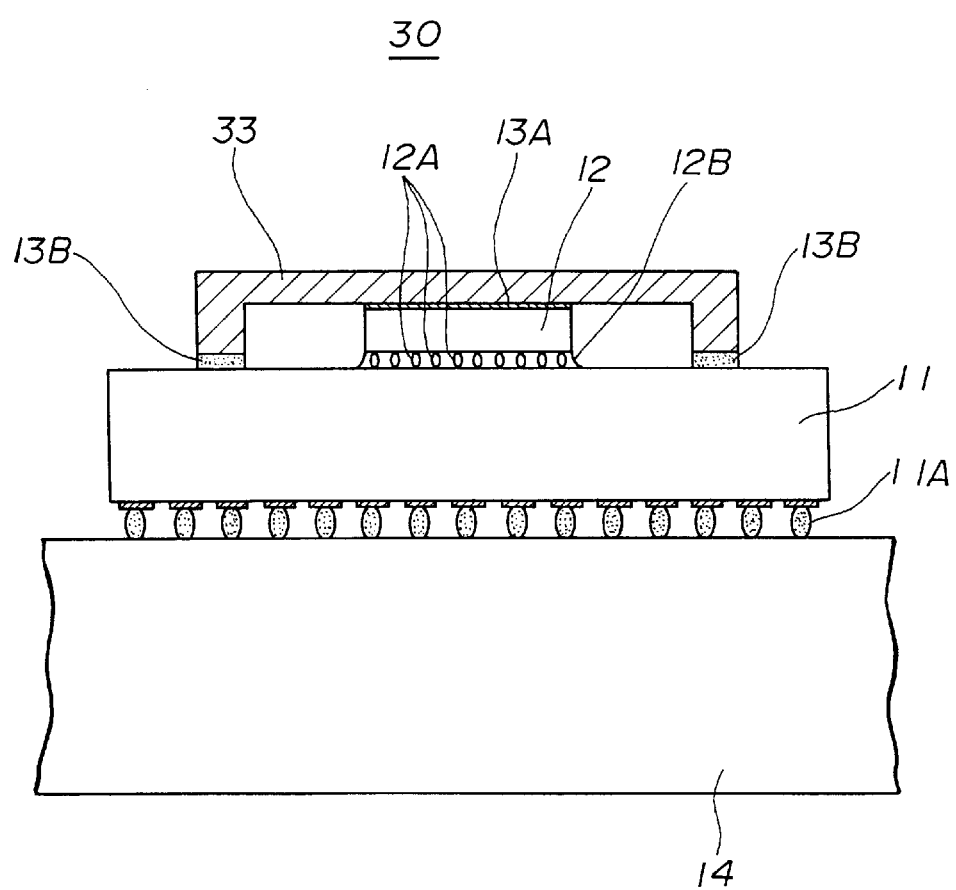
FIG. 4 is a diagram showing the construction of a BGA semiconductor device according to a first embodiment of the present invention.

FIG. 4 shows the construction of a BGA semiconductor device 30 according to a first embodiment of the present invention, wherein those parts of FIG. 4 corresponding to the parts described previously are designated by the same reference numerals and the description thereof will be omitted.

Referring to FIG. 4, the BGA semiconductor device 30 has a construction similar to that of the semiconductor device 10 of FIG. 1, except that the cap member 13 is replaced with a cap member 33. The cap member 33 is formed of a carbon-metal composite block, wherein a porous base block of carbon is infiltrated with Al with a proportion of 18.5 wt %.

In the illustrated example, the package substrate 11 has a thickness of 1.85 mm and a size of 40.0 mm for each edge, while the cap member 33 has a thickness of 2.05 mm in the top part contacting the semiconductor chip 12 and a size of 39.0 mm for each edge. The height of the cap member may be 2.65 mm on the top surface of the package substrate 11.

The cap member 33 thus formed of a carbon-metal composite has a Young modulus of about 12 GPa, which is smaller than the Young modulus of 20 GPa required by the foregoing criteria and has a thermal conductivity of about 200 W/(m·K), which also exceeds the value of the thermal conductivity required by the foregoing criteria. The cap member 33 has a thermal expansion coefficient of $0.9 \times 10^{-5}/°C$., which also falls in the preferable range for the thermal expansion coefficient.

The cap member 33 may also be formed of a C/Al—Si composite. In this case, an Al—Si alloy containing Si with a proportion of about 12% by weight may be used to infiltrate the porous carbon matrix block. The proportion of the Al—Si metal with respect to the porous carbon block is set to about 18%. The cap member 33 thus formed of the C/Al—Si composite has a Young modulus of about 15 GPa.

Figure 5:
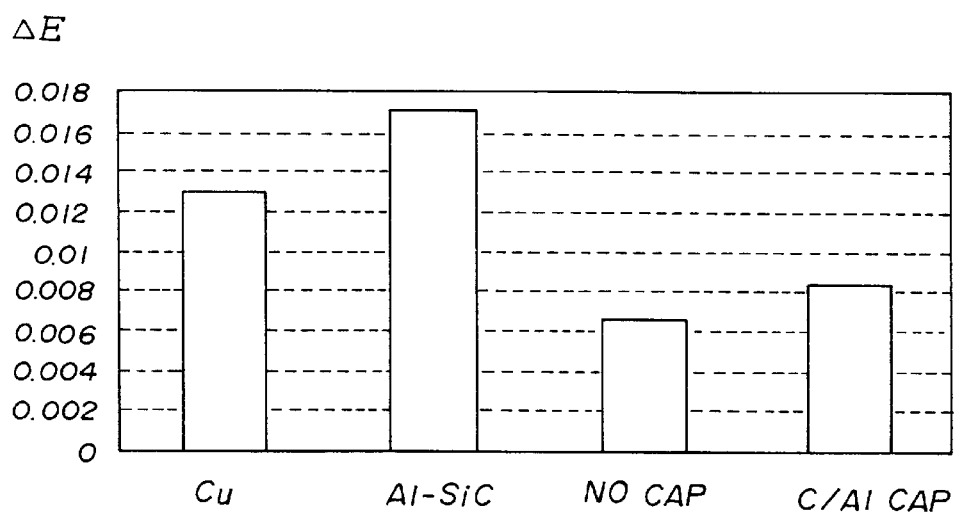
FIG. 5 is a diagram showing the strain caused at a BGA bump in the semiconductor device of FIG. 4 as a result of thermal cycling.

FIG. 5 shows the strain $\Delta\epsilon$ appearing on the bump electrode 11A when a thermal cycle is applied to the semiconductor device 30 of FIG. 4 in comparison with the result of FIG. 3.

Referring to FIG. 5, it can be seen that a strain $\Delta\epsilon$ smaller than 0.01 is realized by using the cap member 33 of a C/Al composite having a Young modulus of 12 GPa. A similar result is obtained also when a C/Al—Si composite is used for the cap member 33.

Second Embodiment

Figure 6:
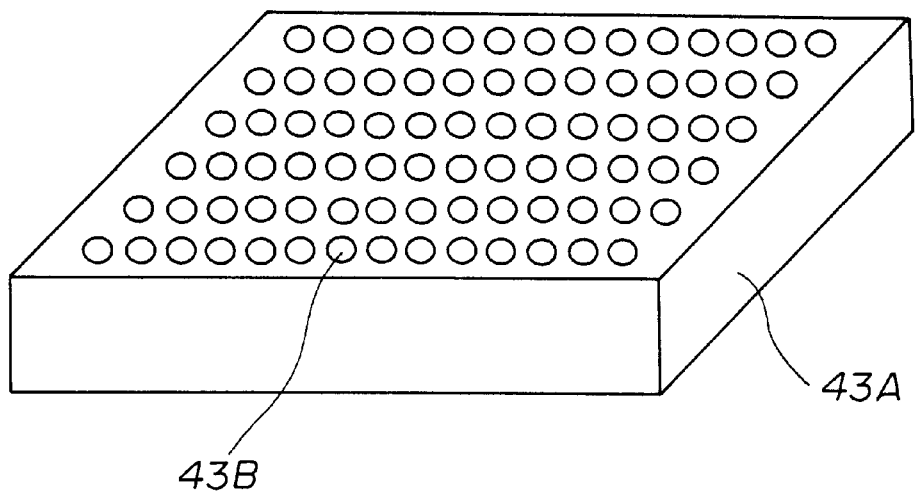
FIGS. 6A and 6B are diagrams showing the construction of a cap member for use in a BGA semiconductor device according to a second embodiment of the present invention.
Figure 6:
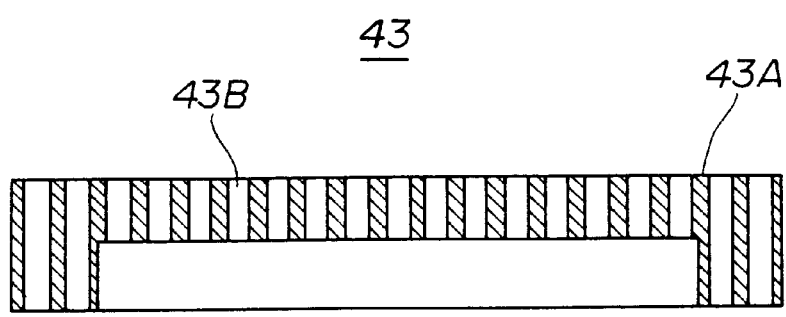

FIGS. 6A and 6B show the construction of a cap member 43 used in a BGA semiconductor device according to a second embodiment of the present invention, wherein the cap member 43 replaces the cap member 33 of FIG. 4. Thus, explanation of those parts of the BGA semiconductor device of the present embodiment explained previously will not be repeated.

Referring to FIGS. 6A and 6B respectively showing the cap member 43 in oblique view and elevational cross-sectional view, the cap member 43 is formed of a porous carbon block 43A having minute pores 43B extending in the thickness direction of the carbon block 43A. The minute pores 43B may have a diameter of about 30 μm and are filled with a plug of Al or an Al—Si alloy. Thereby, each of the Al or Al—Si plugs extend generally in the thickness direction of the porous carbon block, and thus, the cap member 43 shows anisotropy.

More specifically, the cap member 43 shows a smaller Young modulus in the lateral direction than in the thickness direction and thus causes a deformation easily with the thermal expansion of the package substrate 11 when a thermal cycle is applied. Thereby, the heat generated in the semiconductor chip 12 is removed via the cap member 43 to the package substrate 11 and to the environment via the Al or Al—Si plug and the carbon matrix.

Third Embodiment

Figure 7:
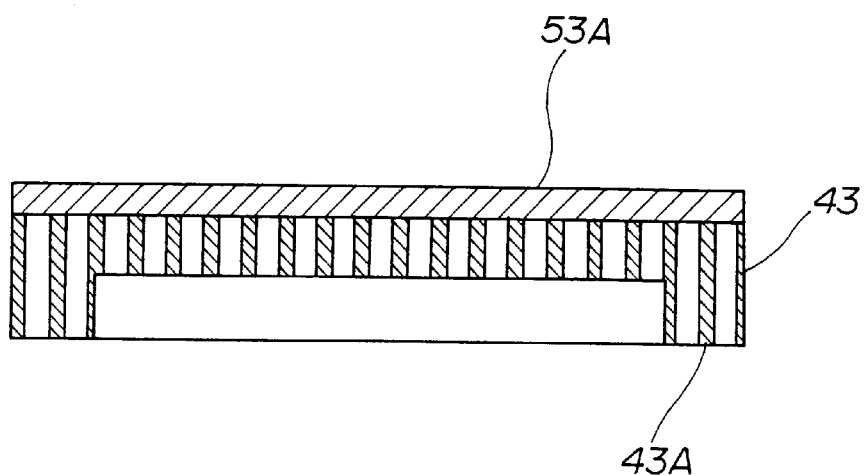
FIG. 7 is a diagram showing the construction of a cap member for use in a BGA semiconductor device according to a third embodiment of the present invention.

FIG. 7 shows the construction of a cap member 53 according to a third embodiment of the present invention, wherein the cap member 53 may be used in the BGA semiconductor device 30 in place of the cap member 33. In FIG. 7, those parts corresponding to the parts described previously are designated by the same reference numerals and the description thereof will be omitted.

Referring to FIG. 7, the cap member 53 is similar to the cap member 43 except that a metal film 53A typically of Al or an Al—Si alloy is provided on the cap member 53. Thereby, the heat generated by the semiconductor chip 12 is conducted efficiently to the metal film 53A via the metal plugs filling the pores 43B in correspondence to the central part of the cap member 53 where the cap member 53 makes a contact with the semiconductor chip 12 and further from the metal film 53A to the package substrate 11 via the metal plug filling the pores 43B at the marginal part of the cap member 53.

Thereby, the anisotropy of the cap member 43 with regard to the thermal conductivity is effectively compensated for, and an efficient lateral heat transfer is realized in the cap member 53 through the metal film 53A.

Fourth Embodiment

Figure 8:
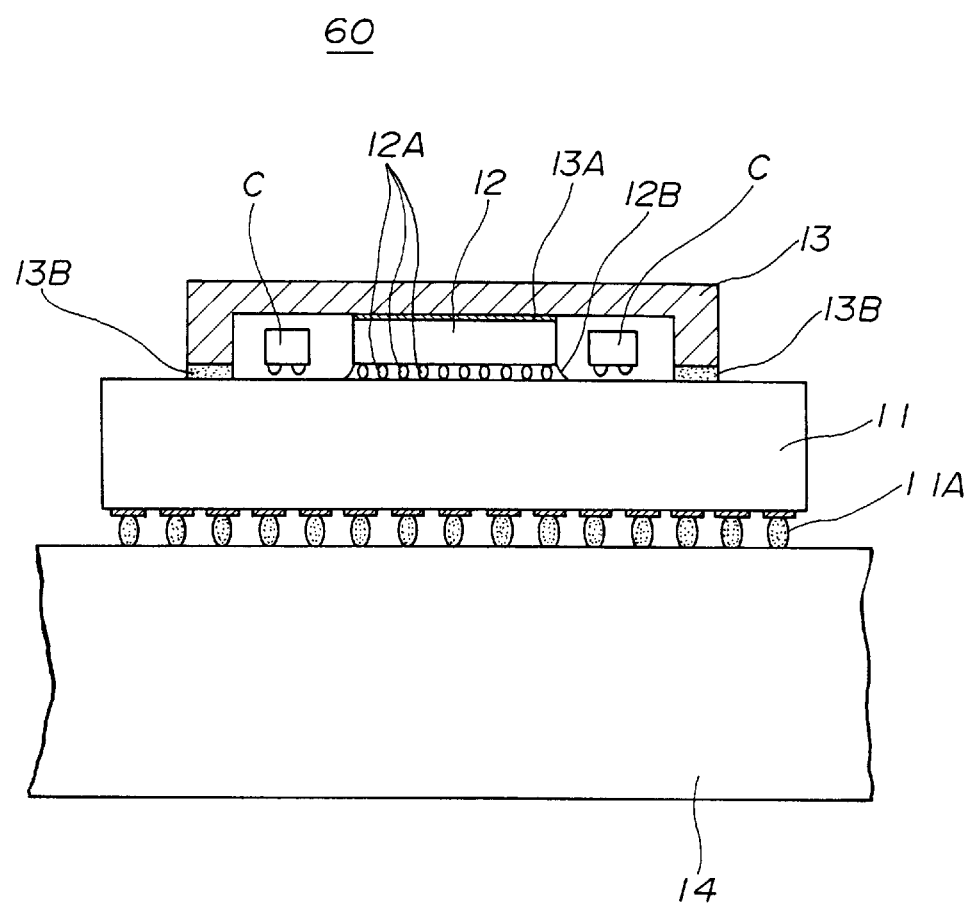
FIG. 8 is a diagram showing the construction of a BGA semiconductor device according to a fourth embodiment of the present invention.

FIG. 8 shows the construction of a BGA semiconductor device 60 according to a fourth embodiment of the present invention, wherein those parts corresponding to the parts described previously are designated by the same reference numerals and the description thereof will be omitted.

Referring to FIG. 8, the semiconductor device 60 includes a capacitor C provided on the top surface of the package substrate 11 in a face-down state in addition to the semiconductor chip 12 such that the capacitor C is located inside the space defined by the cap member 13.

It should be noted that the foregoing construction of FIG. 8 requires a large space inside the cap member 13, and hence a large size for the cap member 13, for accommodating the capacitor C or other element, while the use of the material of low Young modulus for the cap member 13, such as the C/Al or C/Al—Si composite, enables the desired large size for the cap member 13, sufficient for accommodating the capacitor C.

As other aspects of the semiconductor device 60 of FIG. 8 are similar to those of the previous embodiment, further description thereof will be omitted.

Fifth Embodiment

Figure 9:
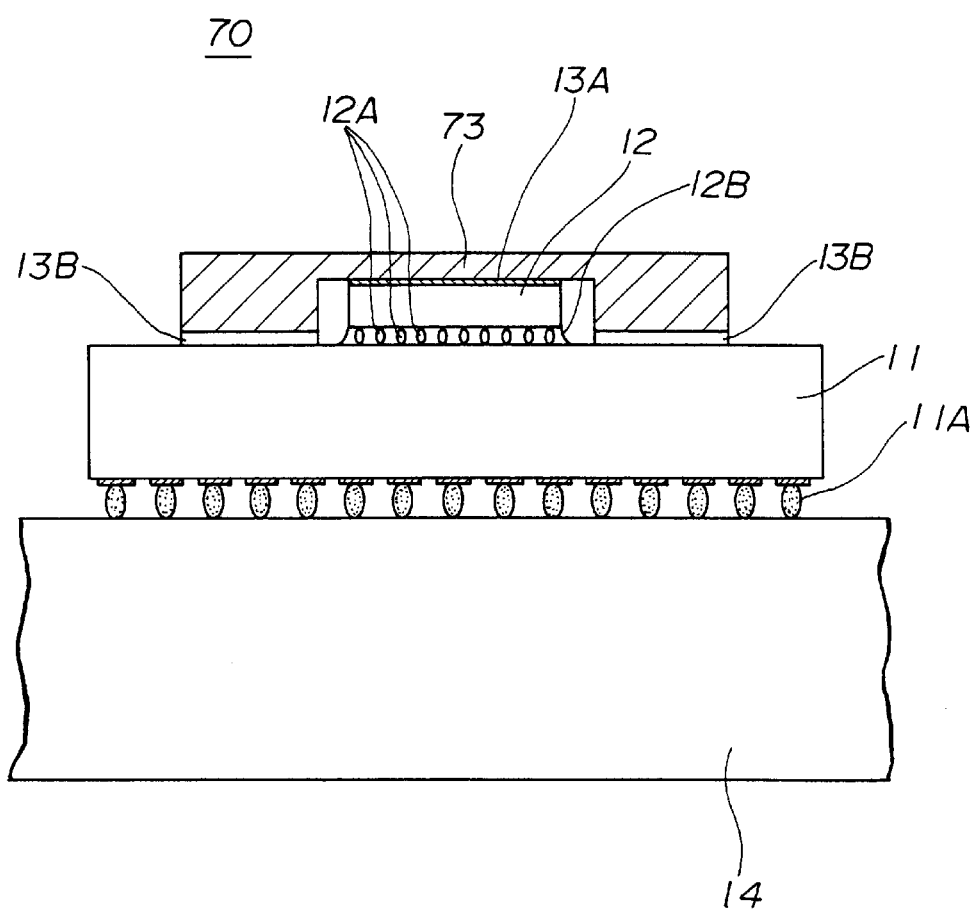
FIG. 9 is a diagram showing the construction of a BGA semiconductor device according to a fifth embodiment of the present invention.

FIG. 9 shows the construction of a BGA semiconductor device 70 according to a fifth embodiment of the present invention, wherein those parts corresponding to the parts described previously are designated by the same reference numerals and the description thereof will be omitted.

Referring to FIG. 9, the semiconductor device 70 includes a cap member 73 of a C/Al or C/Al—Si composite similar to the cap member 33 of FIG. 4, except that the cap member 73 has a reduced space for accommodating the semiconductor chip 12.

As a result of the construction of FIG. 9, the contact area of the cap member 73 making a contact with the package substrate 11 is increased substantially and the efficiency of heat transport from the cap member 73 to the package substrate 11 is improved substantially.

Further, the present invention is not limited to the embodiments described heretofore, but various variations and modifications may be made without departing from the scope of the invention.

What is claimed is:

1. A semiconductor device, comprising:
    a package substrate;
    a semiconductor chip mounted on a top surface of said package substrate in a face-down state;

a cap member provided on said top surface of said package substrate so as to cover said semiconductor chip, said cap member making a contact with said semiconductor chip and said top surface of said package substrate; and electrodes provided on a bottom surface of said package substrate, wherein said cap member, having a thermal conductivity not smaller than about 100 W/(m·K) and a Young modulus not exceeding about 20 GPa, is formed of a carbon/metal composite.

2. A semiconductor device as claimed in claim 1, wherein the cap member has a Young modulus of about 12 GPa.

3. A semiconductor device as claimed in claim 1, wherein said cap member has a thermal conductivity of about 200 W/(m·K).

4. A semiconductor device as claimed in claim 1, wherein said cap member has a thermal expansion coefficient less than about $3 \times 10^{-5}$/° C.

5. A semiconductor device as claimed in claim 4, wherein said cap member is formed of a porous carbon material infiltrated with Al.

6. A semiconductor device as claimed in claim 4, wherein said cap member is formed of a porous carbon material infiltrated with an Al—Si alloy.

7. A semiconductor device as claimed in claim 1, wherein said cap member is an anisotropic material having a smaller Young modulus in a lateral direction parallel to a principal surface of said package substrate than a Young modulus in a thickness direction perpendicular to said lateral direction.

8. A semiconductor device as claimed in claim 7, wherein said cap member includes pores extending generally in said thickness direction, and conductive plugs filling said pores.

9. A semiconductor device as claimed in claim 8, wherein said cap member further includes a metal film covering an outer side of said cap member.

10. A semiconductor device as claimed in claim 1, wherein said package substrate has a Young modulus between about 70 GPa and about 75 GPa.

11. A semiconductor device as claimed in claim 1, wherein said package substrate is formed of a glass-epoxy.

* * * * *